United States Patent
Wu et al.

(10) Patent No.: US 7,369,000 B2
(45) Date of Patent: May 6, 2008

(54) ADAPTIVE FREQUENCY DETECTOR OF PHASE LOCKED LOOP

(75) Inventors: Wen-Yi Wu, Hsin-Chu Hsien (TW); Chao-Lung Tsai, Hsin-Chu (TW); Chi-Kwong Ho, Hsin-Chu (TW)

(73) Assignee: Mediatek Incorporation, Hsin-Chu, Hsien (TW)

( * ) Notice: Subject to any disclaimer, the term of this patent is extended or adjusted under 35 U.S.C. 154(b) by 400 days.

(21) Appl. No.: 10/905,904

(22) Filed: Jan. 26, 2005

(65) Prior Publication Data

US 2005/0242890 A1 Nov. 3, 2005

(30) Foreign Application Priority Data

Apr. 15, 2004 (TW) ................. 93110507 A

(51) Int. Cl.
*H03L 7/00* (2006.01)

(52) U.S. Cl. ............ 331/1 R; 331/16; 331/175; 331/1 A; 369/44.13; 369/44.28; 369/47.28

(58) Field of Classification Search ............ 331/16, 331/1 A, 34, 175; 369/44.13, 44.28, 47.28
See application file for complete search history.

(56) References Cited

U.S. PATENT DOCUMENTS 6,147,530 A * 11/2000 Nogawa ............ 327/156

* cited by examiner

*Primary Examiner*—Arnold Kinkead
(74) *Attorney, Agent, or Firm*—Winston Hsu

(57) ABSTRACT

An adaptive frequency detector used in a phase locked loop for detecting a frequency difference between an input signal and an output clock generated from an oscillator of the phase locked loop includes: a frequency comparator for generating an up signal or a down signal according to the frequency difference between the input signal and the output clock; and a pulse controller coupled to the frequency comparator for generating a charge signal based on the up signal or generating a discharge signal based on the down signal. The pulse controller dynamically adjusts the pulse width of the charge signal or the pulse width of the discharge signal.

26 Claims, 4 Drawing Sheets

ADAPTIVE FREQUENCY DETECTOR OF PHASE LOCKED LOOP

BACKGROUND

The present invention relates to phase-locked loops (PLLs), and more particularly, to an adaptive frequency detector in a PLL.

A phase locked loop (PLL) has many usages, such as clock/data recovery, frequency or phase modulation/demodulation, and generating a clock having stable frequency, so that phase locked loops are widely applied in various electronic devices, consumer products, and communication devices.

In general, a conventional PLL has a phase detector (PD) and a frequency detector (FD). The phase and frequency detector are used for detecting phase error and frequency error, respectively, between an input signal and a feedback signal. The conventional PLL uses a loop filter to adjust the operation of a voltage-controlled oscillator (VCO) according to the detection result of the phase detector and frequency detector until the frequency and phase of the feedback signal match that of the input signal.

Please refer to FIG. 1, which depicts a simplified block diagram of a conventional PLL 100. The PLL 100 has a phase detector 110 for comparing the phase difference between the input signal and the feedback signal. The phase detector 110 adjusts the output current of a phase-error current source 130 by controlling the phase-error current source 130 to charge or discharge according to the phase difference between the input signal and the feedback signal. The PLL 100 further has a frequency detector 120 for comparing the frequency difference between the input signal and the feedback signal. The frequency detector 120 adjusts the output current of a frequency-error current source 140 by controlling the frequency-error current source 140 to charge or discharge according to the frequency difference between the input signal and the feedback signal. In practical implementations, the phase-error current source 130 and the frequency-error current source 140 can be implemented with charge pumps.

The PLL 100 further comprises a loop filter 150 for generating a control voltage according to the sum of currents generated from the phase-error current source 130 and the frequency-error current source 140. The PLL 100 further includes a voltage-controlled oscillator (VCO) 160 for adjusting the frequency of the feedback signal according to the control voltage generated from the loop filter 150 to ensure the frequency and phase of the feedback signal match that of the input signal.

As is well known in the art, the pulse width of the phase error signal generated from the phase detector 110 represents the phase error between the input signal and the feedback signal. However, the pulse width of the frequency error signal generated from the frequency detector 120 is fixed. Therefore, the frequency-error current source 140 influences the performance of the conventional PLL 100. If the PLL 100 uses a frequency-error current source with large output current, the frequency detector 120 may have difficultly converging to the lock-in range. On the other hand, if the PLL 100 uses a frequency-error current source with small output current, the lock-in operation of the PLL 100 may be excessively slow. Moreover, if the maximum output current of the frequency-error current source 140 is too small, the PLL 100 may be unable to enter the locked state.

SUMMARY

It is therefore an objective of the claimed invention to provide an adaptive frequency detector capable of dynamically adjusting the pulse width of its output signal based on associated information of the previous output signal in a phase locked loop to solve the above-mentioned problem.

According to an exemplary embodiment of the present invention, an adaptive frequency detector for detecting the frequency difference between an input signal and an output clock generated from an oscillator of the phase locked loop is disclosed. The adaptive frequency detector includes: a frequency comparator for generating an up signal or a down signal according to a frequency difference between the input signal and the output clock; and a pulse controller electrically connected to the frequency comparator for generating a charge signal according to the up signal or generating a discharge signal according to the down signal; wherein the pulse width of the charge signal or the pulse width of the discharge signal is dynamically adjusted by the pulse controller.

One advantage of the adaptive frequency detector of the present invention is that the pulse width of the charge signal or the pulse width of the discharge signal can be adjusted according to the type and pulse width of the previous output signal.

Another advantage of the adaptive frequency detector of the present invention is that the pulse width of the charge signal or the pulse width of the discharge signal can be adjusted based on the frequency difference between the output clock and the input signal.

Yet another advantage of the adaptive frequency detector of the present invention is that the pulse width of the charge signal or the pulse width of the discharge signal can be adjusted in accordance with the reaction of the previous output signal.

According to another exemplary embodiment of the present invention, a method is disclosed for deciding the pulse width of an output signal of a circuit. The method comprises determining the type of the output signal according to the type of a control signal received by the circuit; and setting the pulse width of the output signal according to the type of the previous output signal generated from the circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
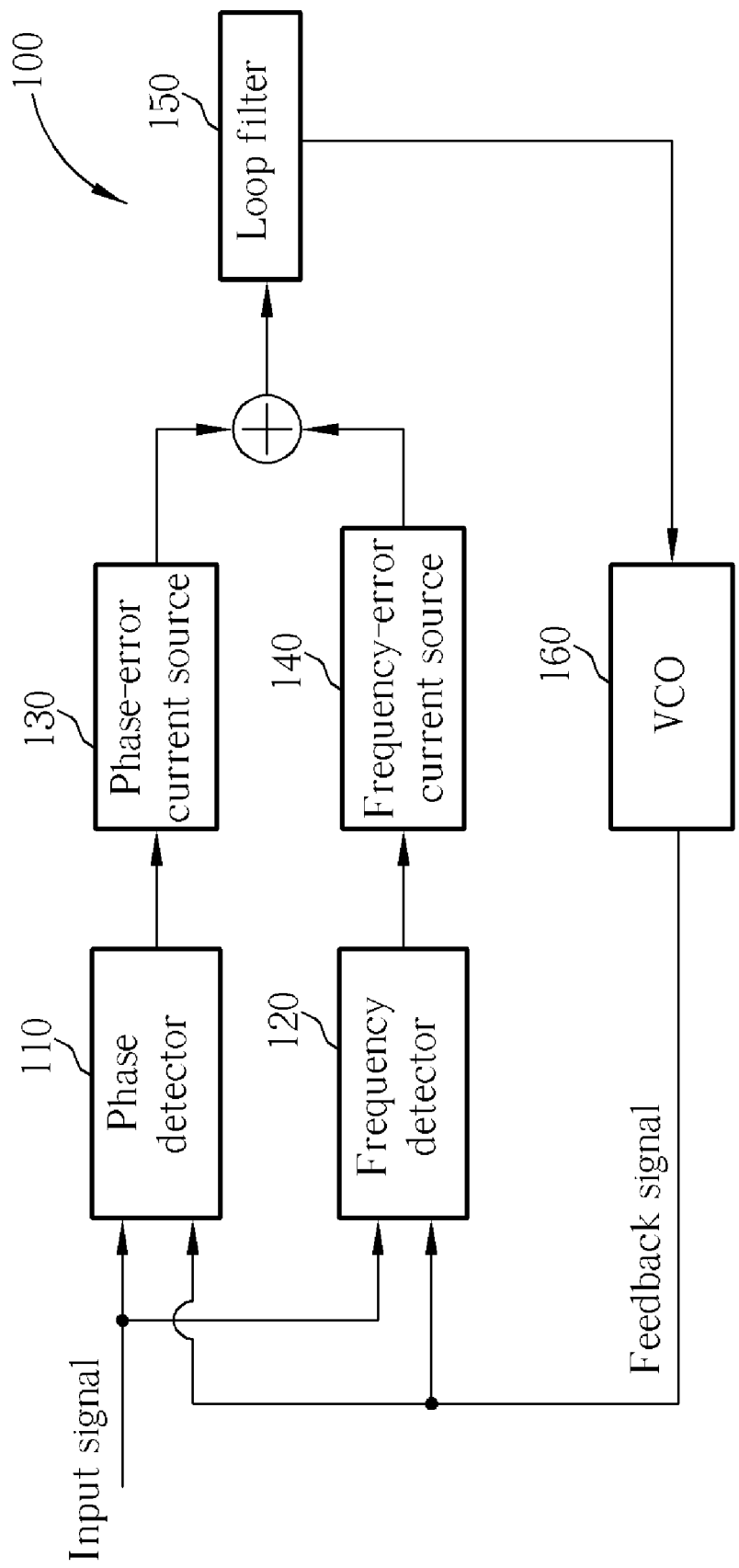
FIG. 1 is a simplified block diagram of a conventional PLL.
Figure 2:
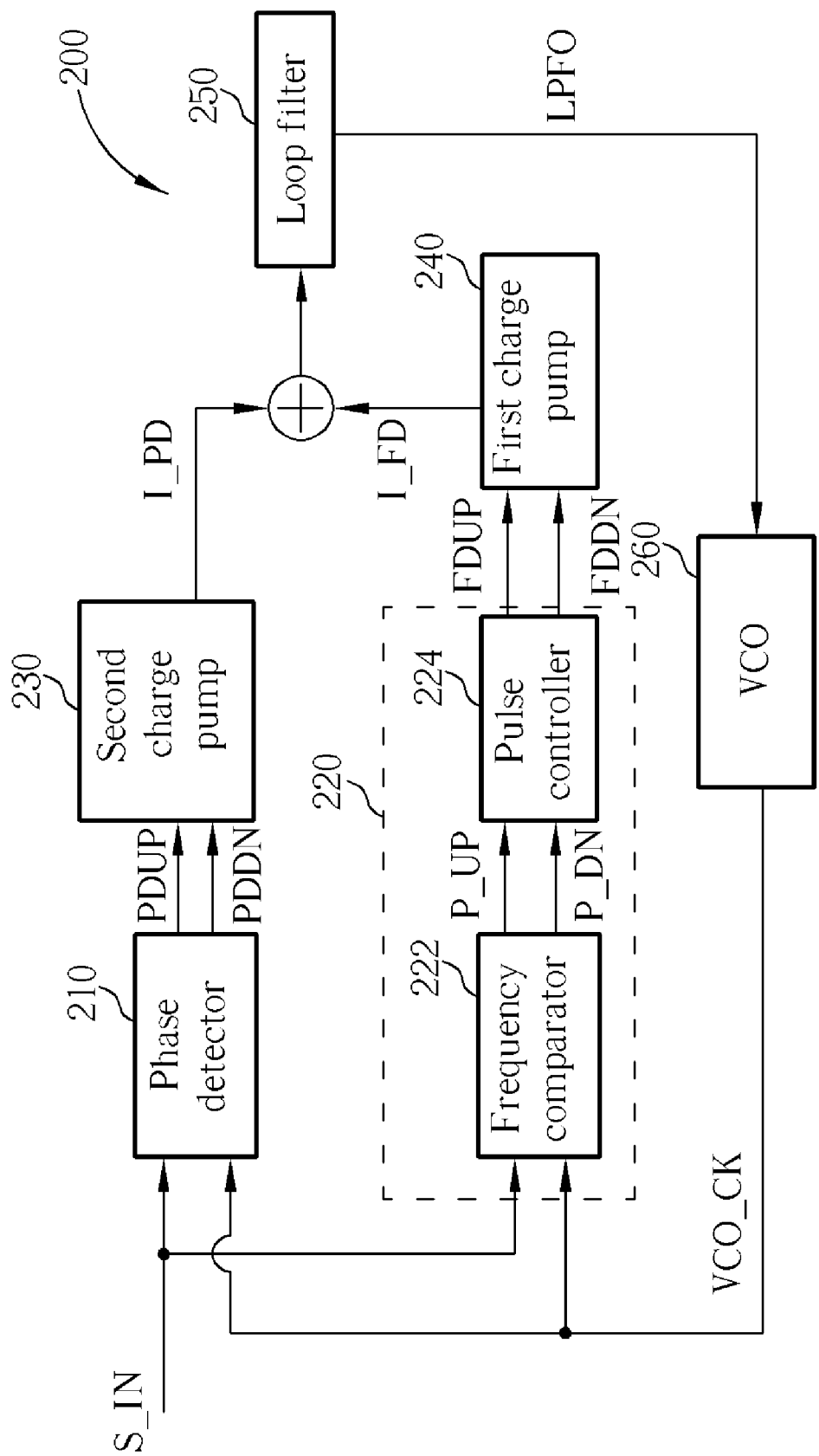
FIG. 2 shows a simplified block diagram of a PLL according to an exemplary embodiment of the present invention.

Please refer to FIG. 2, which shows a simplified block diagram of a PLL 200 according to an exemplary embodiment of the present invention. The PLL 200 comprises an adaptive frequency detector 220 for determining the frequency error (or frequency difference) between an input signal S_IN and an output clock VCO_CK to generate a first change signal FDUP or a first discharge signal FDDN. A first charge pump 240 is electrically connected to the frequency detector 220. Under the control of the output of the frequency detector 220, the first charge pump 240 performs a corresponding charge or discharge operation to adjust the current pump width for a first current I_FD. A phase detector 210 is used for generating a second charge signal PDUP or a second discharge signal PDDN according to the phase error (or phase difference) between the input signal S_IN and the output clock VCO_CK. A second charge pump 230 is electrically connected to the phase detector 210. Similarly, under the control of the output of the phase detector 210, the second charge pump 230 performs a corresponding charge or discharge operation to adjust the current pump width for a second current I_PD. As shown in FIG. 2, a loop filter 250 is electrically connected to the first charge pump 240 and the second charge pump 230. The loop filter 250 is used for generating a control voltage LPFO based on the sum of the output currents of the charge pumps 230 and 240. The PLL 200 further comprises a VCO 260, which is electrically connected to the loop filter 250. The VCO 260 is used for adjusting the frequency of the output clock VCO_CK according to the control voltage LPFO. In a preferred embodiment of the present invention, the input signal S_IN is an RLL-modulated signal, such as an EFM (eight-to-fourteen modulation) signal of the CD specification, an EFM+(eight-to-sixteen modulation) signal of the DVD specification, or similar signal.

In practical implementations, the first charge pump 240 and the second charge pump 230 of the PLL 200 can be implemented with a single charge pump. In addition, for extending the possible usages, the PLL 200 of the present invention can use a frequency divider (not shown) to divide the output clock VCO_CK generated from the VCO 260, and then use the frequency-divided signal as the output signal of the PLL 200.

In this preferred embodiment, the PLL 200 first utilizes the frequency detector 220 to determine the frequency error (e.g., frequency difference) between the input signal SIN and the output clock VCO_CK to thereupon generate the first charge signal FDUP or the first discharge signal FDDN. The first charge pump 240 then adjusts the first current I_FD according to the first charge signal FDUP or the first discharge signal FDDN. Next, the loop filter 250 adjusts the control voltage LPFO based on the first current I_FD to drive the VCO 260 to adjust the frequency of the output clock VCO_CK. When the frequency of the output clock VCO_CK (or the value of the control voltage LPFO) goes into the pull-in range of the phase detector 210, i.e., the frequency-acquisition operation performed by the frequency detector 220 is finished, the PLL 200 disables the frequency detector 220 in order to prevent the phase-acquisition operation performed by the phase detector 210 from being disturbed by the frequency detector 220. In addition, the frequency detector 220 of the present invention adjusts the pulse width of the first charge signal FDUP or the first discharge signal FDDN based on the type (i.e., FDDN or FDUP) and pulse width of a previous output pulse, the reaction of the previous output, or the frequency difference between the output clock and the input signal. Therefore, in the PLL 200 of the present invention, the pulse width of the output of the frequency detector 220 is not fixed.

The phase detector 210 controls the following stage based on the phase difference between the input signal S_IN and the output clock VCO_CK. The operation and architecture of the phase detector 210 can be (but is not limited to) the same as the conventional phase detector 110. The details of the frequency detector 220 of the present invention are described in more detail in the following.

As the embodiment shown in FIG. 2, the frequency detector 220 comprises a frequency comparator 222 and a pulse controller 224 electrically connected to the frequency comparator 222. The frequency comparator 222 is used for comparing the frequency of the input signal S_IN and that of the output clock VCO_CK to thereupon output an up signal P_UP or a down signal P_DN. The pulse controller 224 is used for receiving the up signal P_UP or the down signal P_DN and for generating the first charge signal FDUP or the first discharge signal FDDN accordingly.

Figure 3:
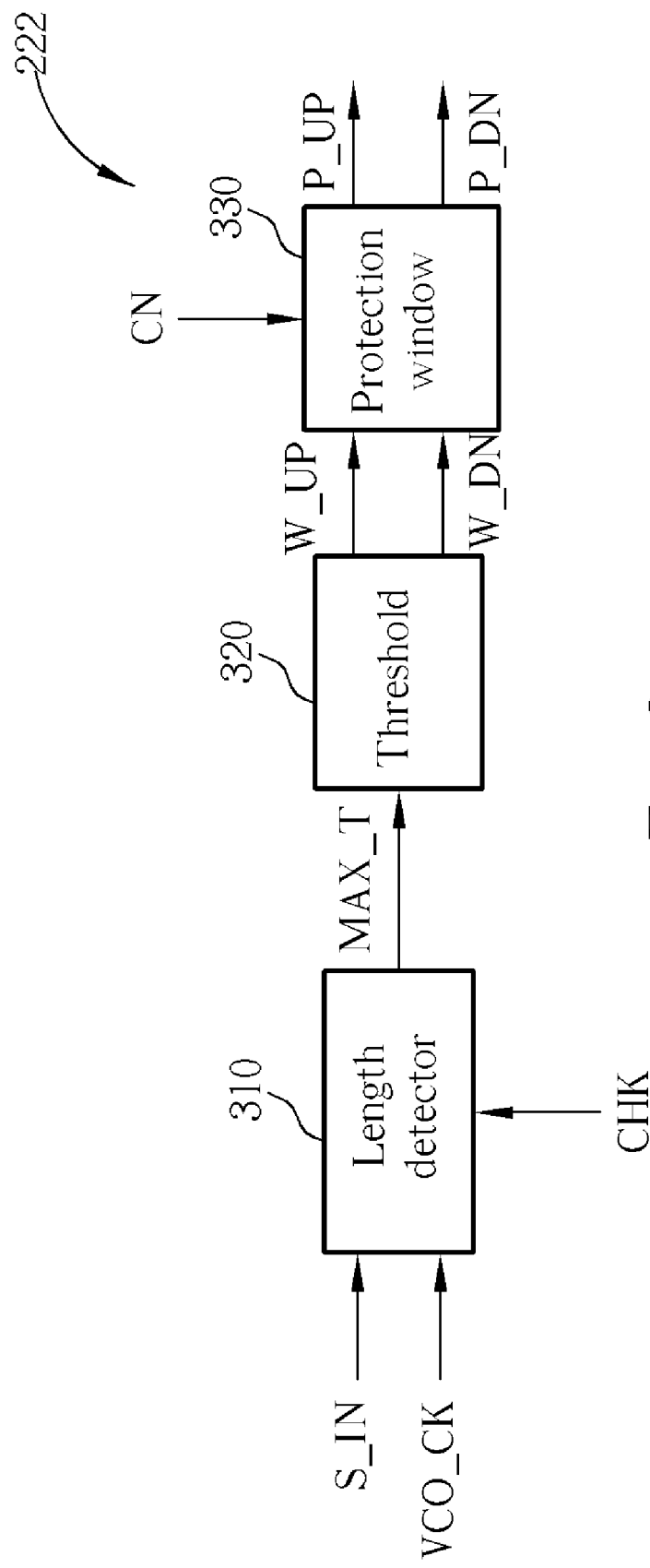
FIG. 3 is a block diagram of the frequency comparator of FIG. 2.

Please refer to FIG. 3, which shows a block diagram of the frequency comparator 222 according to one embodiment of the present invention. In the frequency comparator 222, a length detector 310 uses the output clock VCO_CK as a working clock and measures the maximum or minimum run length of the input signal S_IN within a period corresponding to a predetermined number of pulses. The predetermined number can be adjusted according to a programmable value CHK. In a preferred embodiment, the length detector 310 is used for generating a count value MAX_T by detecting the maximum run length of the input signal S_IN within the period set by the programmable value CHK. For example, if the input signal S_IN is the EFM signal used in the CD specification, the maximum run length measured by the length detector 310 when the PLL 200 is locked should be 11 due to the legal run length being between 3T and 11T, wherein T is the basic period of the EFM signal. If the input signal S_IN is the EFM+ signal used in the DVD specification, the maximum run length measured by the length detector 310 when the PLL 200 is locked should be 14. In actual implementations, the programmable value CHK can be adjusted depending on the type of the input signal S_IN (or the format of optical discs) and is not necessarily limited to a specific number. For example, if the input signal S_IN is the EFM signal, the programmable value CHK can be set to 588 or above to guarantee that the length detector 310 has enough detection length to detect the maximum run length of the input signal S_IN.

For improving the resolution of the frequency detector 220 while detecting the frequency difference between the input signal S_IN and the output clock VCO_CK, the length detector 310 can be designed to detect the maximum signal length among three (or more) continuous transitions, such as 1→0→1→0 or 0→1→0→1, within the input signal S_IN. According to the specific arrangement of the sync pattern of CD or DVD application, when the PLL 200 is locked, the count value MAX_T generated from the length detector 310 should be 22 for an EFM signal (sync symbol=11T(high)+11T(low) or 11T(low)+11T(high)). In the case of an EFM+ signal, the count value MAX_T generated from the length detector 310 should be 18 (sync symbol=14T(high)+4T(low) or 4T(high)+14T(low)). In this way, the resolution of the frequency detector 220 in detecting the frequency difference between the input signal S_IN and the output clock VCO_CK can be improved. In addition, if both the falling edge and the rising edge of the output clock VCO_CK are employed in the frequency detector 220, the detection resolution can be doubled. As described above, the length detector 310 of the embodiment uses the output clock VCO_CK as the working clock to measure the maximum run length of the input signal S_IN. Therefore, supposing that the input signal S_IN is the EFM signal, if the count value MAX_T generated by the length detector 310 is greater than 22, it means that the frequency of the output clock VCO_CK is higher than that of the input signal S_IN. On the contrary, if the count value MAX_T is less than 22, it means that the frequency of the output clock VCO_CK is lower than that of the input signal S_IN.

In the preferred embodiment of the present invention, the frequency comparator 222 utilizes a threshold 320 to set a protected region and to determine if the count value MAX_T is within the protected region. For example, the protected region can be configured as $21 \leq MAX\_T \leq 23$ for the EFM signal and can be configured as $17 \leq MAX\_T \leq 19$ for the EFM+ signal. When the count value MAX_T is located within the protected region, this means that the frequency of the output clock VCO_CK is very close to the frequency of the input signal S_IN. In this situation, the frequency detector 220 should stop the charge or discharge operation of the following stage to prevent the operation of the phase detector 210 from being disturbed. Thus, in the frequency detector 220 of the present invention, the frequency comparator 222 determines if the frequency of the output clock VCO_CK is close to the frequency of the input signal S_IN by checking the magnitude of the count value MAX_T using the threshold 320. When the count value MAX_T is greater than the upper threshold value of the protected region, this means that the frequency of the output clock VCO_CK is higher than the frequency of the input signal S_IN. Accordingly, the threshold 320 enables a downward signal W_DN. On the contrary, when the count value MAX_T is smaller than the lower threshold value of the protected region, it means that the frequency of the output clock VCO_CK is lower than the frequency of the input signal S_IN. Therefore, the threshold 320 enables an upward signal W_UP.

Sometimes defects in the source of the input signal S_IN, such as scratches on an optical disc, incorrect etching while data writing or the like, may result in the length detector 310 making an erroneous measurement. In the preferred embodiment of the present invention, the frequency comparator 222 further uses a protection window 330 to verify the output of the threshold 320 in order to reduce the probability of erroneous measurements made by the length detector 310. In this embodiment, the protection window 330 verifies the output of the threshold 320 in accordance with an adjustable criterion number CN. For example, the protection window 330 enables the up signal P_UP only when the number of received continuous pulses of the upward signal W_UP meets the requirement of the criterion number CN. Similarly, the protection window 330 enables the down signal P_DN only when the number of received continuous pulses of the downward signal W_DN meets the requirement of the criterion number CN. In this embodiment, the response speed of the frequency detector 220 can be improved by setting the criterion number CN to a small value (e.g., 1 or 2). Alternatively, the noise immunity of the frequency detector 220 can be improved by setting the criterion number CN to a larger value (e.g., 7 or 8).

In other words, when the frequency comparator 222 enables the up signal P_UP, this means that the frequency of the output clock VCO_CK is lower than the frequency of the input signal S_IN. When the frequency comparator 222 enables the down signal P_DN, this means that the frequency of the output clock VCO_CK is higher than the frequency of the input signal S_IN.

Figure 4:
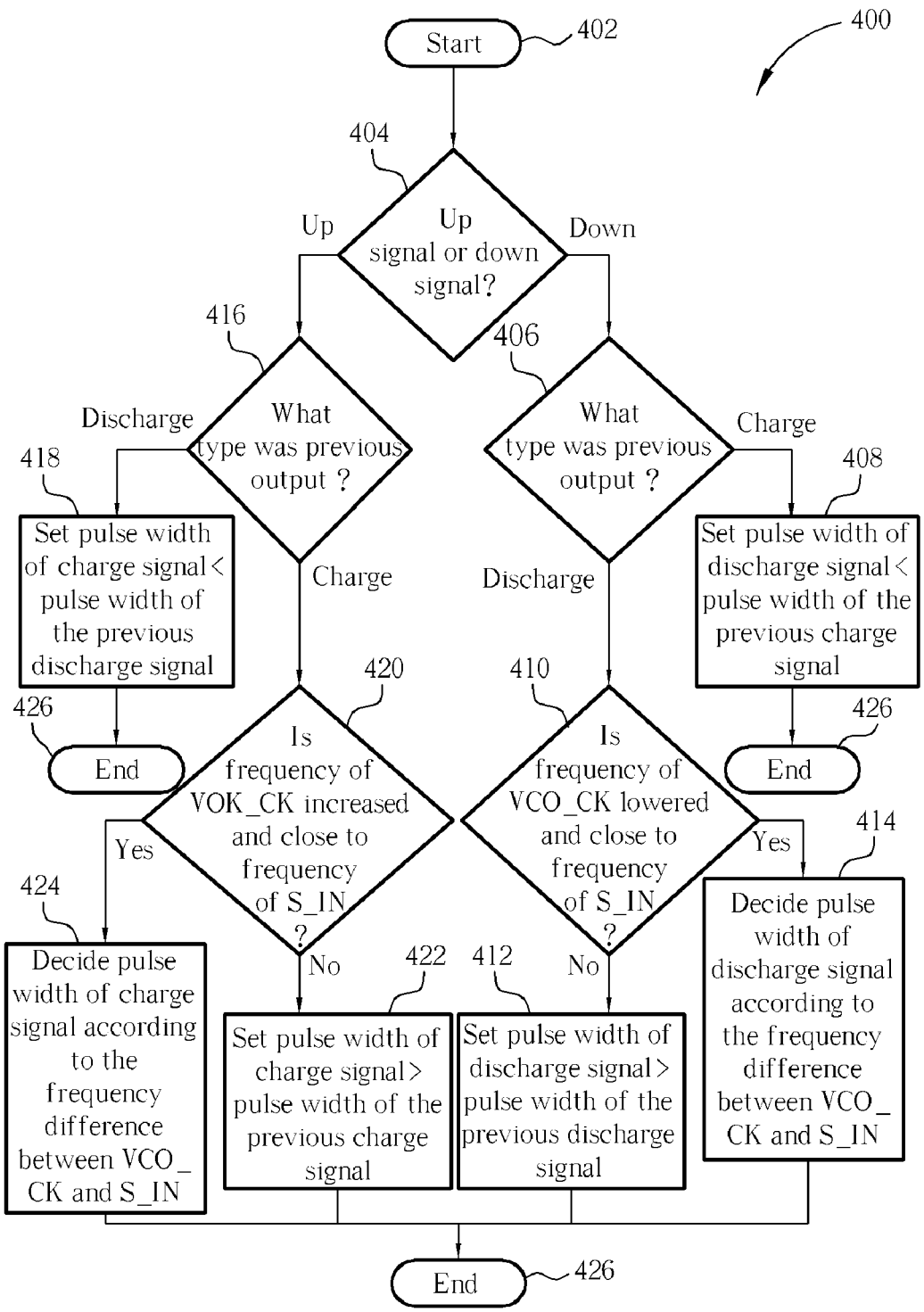
FIG. 4 is a flowchart illustrating deciding the pulse width of the output signal of the pulse controller of FIG. 2 according to an exemplary embodiment of the present invention.

Please refer to FIG. 4, as well as to FIG. 2. FIG. 4 shows a flowchart illustrating an embodiment of how the pulse controller 224 decides the pulse width of its output signal. As mentioned above, the pulse controller 224 shown in FIG. 2 is used for receiving the up signal P_UP or the down signal P_DN outputted from the frequency comparator 222 and for thereupon generating the first charge signal FDUP or the first discharge signal FDDN. In the PLL 200, the first charge pump 240 then performs a corresponding charge operation based on the pulse width of enabled pulse of the first charge signal FDUP to make the loop filter 250 raise the control voltage LPFO; or performs a corresponding discharge operation based on the pulse width of enabled pulse of the first discharge signal FDDN to make the loop filter 250 pull-down the control voltage LPFO. Note that the flowchart 400 shown in FIG. 4 is a preferred embodiment of deciding the active pulse width of the first charge signal FDUP or the first discharge signal FDDN made by the pulse controller 224.

In step 404, the pulse controller 224 first determines the type of a received active pulse, i.e. determines whether the received active pulse belongs to the up signal P_UP or the down signal P_DN. If the received pulse belongs to the down signal P_DN, this means that the pulse controller 224 needs to generate the first discharge signal FDDN. In this situation, the pulse controller 224 then performs step 406 to decide a pulse width for the first discharge signal FDDN to be outputted. Conversely, if the received pulse belongs to the up signal P_UP, this means that the pulse controller 224 needs to generate the first charge signal FDUP, so that the pulse controller 224 then performs step 416 to decide a pulse width for the first charge signal FDUP to be outputted. The right half of the flowchart 400 is described in the following.

In step 406, the pulse controller 224 determines the type of a previous output pulse. If the previous output pulse belongs to the first charge signal FDUP, the pulse controller 224 proceeds to step 408. Supposing that the pulse width of the previous output pulse of the first charge signal FDUP is T1. If the pulse controller 224 sets the pulse width T2 of the pulse of the first discharge signal FDDN to be outputted to a value equal to or greater than T1 in step 408, it is obvious that the effect on the following stage (e.g., the first charge pump 240) caused by the previous output will be completely canceled out by the new output. An even worse result is that the new output pulse (with the pulse width T2) may cause the frequency of the output clock VCO_CK to deviate from a target frequency (i.e., the frequency of the input signal S_IN). Accordingly, when the type of the previous output pulse is different with the type of the pulse to be outputted, the pulse controller 224 of the present invention sets the pulse width T2 of the pulse of the first discharge signal FDDN to be outputted to a value less than T1. For example, the pulse width T2 can be set to be one-half or one-third of the pulse width T1.

On the other hand, in step 406, if the previous output pulse belongs to the first discharge signal FDDN, the pulse controller 224 proceeds to step 410. In step 410, since the pulse to be outputted also belongs to the first discharge signal FDDN, the pulse controller 224 sets the pulse width T2 for the pulse to be outputted while considering the reaction of the previous output pulse.

The pulse width of the previous output pulse of the first discharge signal FDDN is also assumed as T1. If the frequency of the output clock VCO_CK is lowered by the effect of the previous output pulse of the first discharge signal FDDN, and the frequency difference between the output clock VCO_CK and the input signal S_IN is reduced to a predetermined range, this means that the frequency of the output clock VCO_CK is close to the frequency of the input signal S_IN. Accordingly, the pulse controller 224 proceeds to step 414. In step 414, the pulse controller 224 sets the pulse width T2 of the pulse of the first discharge signal FDDN to be outputted in accordance with the frequency difference between the output clock VCO_CK and the input signal S_IN. In practical implementations, the pulse controller 224 can use a lookup table or calculate a specific equation to obtain the pulse width T2. However, if the frequency difference between the output clock VCO_CK and the input signal S_IN is not reduced to the predetermined range by the effect of the previous output pulse of the first discharge signal FDDN, it is known that the effect of the previous output pulse is not enough. In this situation, the pulse controller 224 proceeds to step 412 to set the pulse width T2 of the pulse of the first discharge signal FDDN to be outputted to a value greater than the pulse width T1 of the previous output pulse. For example, the pulse width T2 can be set to 2 times or 1.5 times of T1 or to a value of T1 plus a specific value.

The operation of the left half of the flowchart 400, i.e., steps 416 through 424, are substantially the same with steps 406 through 414. Therefore, for brevity, the details of steps 416 through 424 are omitted here. Afterward, the pulse controller 224 records the value of the pulse width T2 in step 426 as the reference of the next output pulse.

As mentioned above, when the frequency of the output clock VCO_CK (or the magnitude of the control voltage LPFO generated from the loop filter 250) goes into the pull-in range of the phase detector 210, the PLL 200 disables the frequency detector 220 to prevent the phase-acquisition operation performed by the phase detector 210 from being disturbed. In implementations, the PLL 200 can disable the frequency detector 220 by stopping the operation of the pulse controller 224. In this way, the frequency detector 220 can be regarded as being disabled because the frequency detector 220 is unable to enable the first charge signal FDUP or the first discharge signal FDDN. In practice, the PLL 200 of the present invention can achieve the same objective by adjusting the criterion number CN of the protection window 330 of the frequency comparator 222. For example, before the frequency of the output clock VCO_CK goes into the pull-in range of the phase detector 210, the PLL 20 can set the criterion number CN to a small value (e.g., 2 or 3) to improve the response speed of the frequency detector 220. When the frequency of the output clock VCO_CK goes into the pull-in range of the phase detector 210, the PLL 20 can set the criterion number CN to a larger value (e.g., 30 or 40) to improve the noise immunity of the PLL 200.

In a preferred embodiment, the frequency detector 220 shown in FIG. 2 further comprises a timeout counter (not shown). The timeout counter is used for counting the clock periods from the time the frequency detector 220 stops enabling the first charge signal FDUP or the first discharge signal FDDN. In this embodiment, when the frequency of the output clock VCO_CK is located within a predetermined range set by the frequency detector 220, the frequency detector 220 stops enabling the first charge signal FDUP or the first discharge signal FDDN. At that moment, the phase detector 210 starts to perform the phase-acquisition operation. Therefore, if the frequency of the output clock VCO_CK (or the magnitude of the control voltage LPFO) can not successfully enter the pull-in range of the phase detector 210 when the timeout counter exceeds a predetermined time period (or clock period count), the frequency detector 220 of the present invention will forcibly enable the first charge signal FDUP or the first discharge signal FDDN to force the output clock VCO_CK (or the control voltage LPFO) to leave the dead state in order to make the PLL 200 to re-perform the lock-in operation.

As described above, the frequency error (or difference) between the output clock VCO_CK and the input signal S_IN of the PLL 200 can be quickly converged to a desired range by using the frequency detector 220. Accordingly, the response speed of the PLL 200 is thereby improved.

In contrast to the fixed pulse width of the signal outputted from the conventional frequency detector, the frequency detector 220 of the present invention adjusts the pulse width of the first charge signal FDUP or the first discharge signal FDDN in accordance with the type, pulse width, or system reaction of the previous output, or the frequency difference between the output clock and the input signal of the PLL 200. Obviously, the frequency detector 220 of the present invention is capable of improving the performance of the PLL 200, the design flexibility for other components (e.g., the first charge pump 240 and the second charge pump 230), and saving the energy requirement in following stages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adaptive frequency detector in a phase locked loop (PLL) for detecting a frequency difference between an input signal and an output clock generated from an oscillator of the phase locked loop, the adaptive frequency detector comprising:
    a frequency comparator for generating an up signal or a down signal according to the frequency difference between the input signal and the output clock; and
    a pulse controller electrically connected to the frequency comparator for generating a charge signal according to the up signal or generating a discharge signal according to the down signal;
    wherein the pulse controller forcibly generates the charge signal or the discharge signal if the PLL does not enter a lock-in range within a predetermined time, and the pulse controller dynamically adjusts the pulse width of the charge signal or the pulse width of the discharge signal according to the type and pulse width of the previous output.

2. The adaptive frequency detector of claim 1, wherein the up signal represents that the frequency of the output clock is less than that of the input signal, and the down signal represents that the frequency of the output clock is greater than that of the input signal.

3. The adaptive frequency detector of claim 1, wherein the pulse controller adjusts the pulse width of the charge signal or the discharge signal further according to the frequency difference between the output clock and the input signal.

4. The adaptive frequency detector of claim 1, wherein the pulse controller adjusts the pulse width of the charge signal or the discharge signal further according to the reaction of the previous output.

5. The adaptive frequency detector of claim 1, wherein the pulse controller adjusts the pulse width of the charge signal or the discharge signal further according to the reaction of the previous output and the frequency difference between the output clock and the input signal.

6. The adaptive frequency detector of claim 1, wherein the pulse controller disables the function of the adaptive frequency detector when the PLL enters a lock-in range.

7. The adaptive frequency detector of claim 1, wherein the frequency comparator stops generating the up signal and the down signal when the PLL enters a lock-in range.

8. The adaptive frequency detector of claim 1, wherein the frequency comparator comprises:
- a length detector for counting the run length of the input signal within a predetermined period according to the output clock to generate a corresponding count value; and
- a threshold for comparing the count value and two threshold values to generate an upward signal or a downward signal;
- wherein the frequency comparator generates the up signal when the number of continuous pulses of the upward signal reaches a criterion number or generates the down signal when the number of continuous pulses of the downward signal reaches the criterion number.

9. The adaptive frequency detector of claim 8, wherein the frequency comparator increases the criterion number when the PLL enters a lock-in range.

10. The adaptive frequency detector of claim 1, wherein the pulse controller forcibly generates a charge signal or a discharge signal if a phase detector of the PLL operates over a predetermined time and does not make the PLL enter a lock-in range.

11. The adaptive frequency detector of claim 1, wherein the input signal is an RLL-modulated signal.

12. An adaptive frequency detector in a phase locked loop (PLL) for detecting a frequency difference between an input signal and an output clock generated from an oscillator of the phase locked loop, the adaptive frequency detector comprising:
- a frequency comparator for generating an up signal or a down signal according to the frequency difference between the input signal and the output clock, wherein the frequency comparator comprises:
  - a length detector for counting the run length of the input signal within a predetermined period according to the output clock to generate a corresponding count value; and
  - a threshold for comparing the count value and two threshold values to generate an upward signal or a downward signal;
  - wherein the frequency comparator generates the up signal when the number of continuous pulses of the upward signal reaches a criterion number or generates the down signal when the number of continuous pulses of the downward signal reaches the criterion number; and
- a pulse controller electrically connected to the frequency comparator for generating a charge signal according to the up signal or generating a discharge signal according to the down signal;
- wherein the pulse width of the charge signal or the pulse width of the discharge signal is dynamically adjusted by the pulse controller.

13. The adaptive frequency detector of claim 12, wherein the frequency comparator increases the criterion number when the PLL enters a lock-in range.

14. An adaptive frequency detector in a phase locked loop (PLL) for detecting a frequency difference between an input signal and an output clock generated from an oscillator of the phase locked loop, the adaptive frequency detector comprising:
- a frequency comparator for generating an up signal or a down signal according to the frequency difference between the input signal and the output clock; and
- a pulse controller electrically connected to the frequency comparator for generating a charge signal according to the up signal or generating a discharge signal according to the down signal;
- wherein the pulse width of the charge signal or the pulse width of the discharge signal is dynamically adjusted by the pulse controller, and if the PLL does not enter a lock-in range within a predetermined time, the pulse controller forcibly generates a charge signal or a discharge signal.

15. An adaptive frequency detector in a phase locked loop (PLL) for detecting a frequency difference between an input signal and an output clock generated from an oscillator of the phase locked loop, the adaptive frequency detector comprising:
- a frequency comparator for generating an up signal or a down signal according to the frequency difference between the input signal and the output clock; and
- a pulse controller electrically connected to the frequency comparator for generating a charge signal according to the up signal or generating a discharge signal according to the down signal;
- wherein the pulse width of the charge signal or the pulse width of the discharge signal is dynamically adjusted by the pulse controller, and if a phase detector of the PLL operates over a predetermined time and does not make the PLL enter a lock-in range, the pulse controller forcibly generates a charge signal or a discharge signal.

16. A method for detecting a frequency difference between an input signal and an output clock generated from an oscillator of the phase locked loop (PLL), the method comprising:
- generating an up signal or a down signal according to the frequency difference between the input signal and the output clock;
- generating a charge signal according to the up signal or generating a discharge signal according to the down signal, and forcibly generating the charge signal or the discharge signal if the PLL does not enter a lock-in range within a predetermined time; and
- dynamically adjusting the pulse width of the charge signal or the pulse width of the discharge signal according to the type and pulse width of the previous output.

17. The method of claim 16, wherein the up signal represents that the frequency of the output clock is less than that of the input signal, and the down signal represents that the frequency of the output clock is greater than that of the input signal.

18. The method of claim 16, further comprising:
- adjusting the pulse width of the charge signal or the discharge signal further according to the frequency difference between the output clock and the input signal.

19. The method of claim 16, further comprising:
- adjusting the pulse width of the charge signal or the discharge signal further according to the reaction of the previous output.

20. The method of claim 16, further comprising:
- adjusting the pulse width of the charge signal or the discharge signal further according to the reaction of the previous output and the frequency difference between the output clock and the input signal.

21. The method of claim 16, further comprising:
- disabling the function of the adaptive frequency detector when the PLL enters a lock-in range.

22. The method of claim 16, wherein the step of generating the up signal and the down signal is stopped when the PLL enters a lock-in range.

23. The method of claim 16, further comprising:
counting the run length of the input signal within a predetermined period according to the output clock to generate a corresponding count value;
comparing the count value and two threshold values to generate an upward signal or a downward signal; and
generating the up signal when the number of continuous pulses of the upward signal reaches a criterion number, or generating the down signal when the number of continuous pulses of the downward signal reaches the criterion number.

24. The method of claim 23, further comprising:
increasing the criterion number when the PLL enters a lock-in range.

25. The method of claim 16, further comprising:
forcibly generating a charge signal or a discharge signal if a phase detection of the PLL operates over a predetermined time and does not make the PLL enter a lock-in range.

26. The method of claim 16, wherein the input signal is an RLL-modulated signal.

* * * * *